United States Patent
Ross

(10) Patent No.: US 10,637,478 B1
(45) Date of Patent: Apr. 28, 2020

(54) BRIDGED INTEGRATED CIRCUITS

(71) Applicant: Google LLC, Mountain View, CA (US)

(72) Inventor: Jonathan Ross, Mountain View, CA (US)

( * ) Notice: Subject to any disclaimer, the term of this patent is extended or adjusted under 35 U.S.C. 154(b) by 0 days.

(21) Appl. No.: 16/530,866

(22) Filed: Aug. 2, 2019

Related U.S. Application Data

(63) Continuation-in-part of application No. 15/811,191, filed on Nov. 13, 2017, now Pat. No. 10,374,608.

(60) Provisional application No. 62/423,350, filed on Nov. 17, 2016.

(51) Int. Cl.
- *H03K 19/177* (2020.01)
- *H03K 19/17732* (2020.01)
- *H03K 19/17736* (2020.01)
- *H03K 19/17796* (2020.01)

(52) U.S. Cl.
CPC .. *H03K 19/17732* (2013.01); *H03K 19/17744* (2013.01); *H03K 19/17796* (2013.01)

(58) Field of Classification Search
CPC ....... H03K 19/17732; H03K 19/17744; H03K 19/17796
USPC .......................................................... 326/38
See application file for complete search history.

(56) References Cited

U.S. PATENT DOCUMENTS

| | | | | |
|---|---|---|---|---|
| 5,687,325 | A * | 11/1997 | Chang | G06F 15/7867 326/39 |
| 7,126,214 | B2 * | 10/2006 | Huppenthal | G06F 15/7867 257/686 |
| 7,774,526 | B2 | 8/2010 | James et al. | |
| 8,484,608 | B2 | 7/2013 | Delp et al. | |
| 9,000,802 | B2 * | 4/2015 | Fitton | G06F 13/385 326/41 |
| 9,317,482 | B2 | 4/2016 | Davis et al. | |
| 9,378,321 | B2 | 6/2016 | Hosney et al. | |
| 2011/0138158 | A1 * | 6/2011 | Mitsuhashi | G06F 9/30145 712/245 |

* cited by examiner

*Primary Examiner* — Daniel D Chang
(74) *Attorney, Agent, or Firm* — Fish & Richardson P.C.

(57) ABSTRACT

Methods, systems, and apparatus, including a system that includes a first integrated circuit chip configured to store application logic for one or more executable applications; and a second integrated circuit chip communicatively coupled to the first integrated circuit chip, the second integrated circuit chip including an instruction decoder configured to decode instructions for executing the one or more executable applications; and a communication interface configured to transmit the decoded instructions to the first integrated circuit chip to execute the one or more executable applications on the first integrated circuit chip.

18 Claims, 3 Drawing Sheets

BRIDGED INTEGRATED CIRCUITS

CROSS-REFERENCE TO RELATED APPLICATIONS

This application is a continuation application of U.S. application Ser. No. 15/811,191, filed on Nov. 13, 2017, which claims the benefit of U.S. Application Ser. No. 62/423,350, filed on Nov. 17, 2016, the entire contents of each are hereby incorporated by reference.

BACKGROUND

This specification generally relates to a computing apparatus that decodes instructions and executes an application on different integrated circuit chips.

SUMMARY

According to one innovative aspect of the subject matter described in this specification, a first integrated circuit chip such as a field-programmable gate array (FPGA) and a second integrated circuit chip such as an application-specific integrated circuit (ASIC) may be arranged on the same circuit board. The FPGA may be designed to perform functions including fetching instructions from a memory and decoding instructions for executing application logic for an application, while the ASIC may be designed to perform functions including executing the decoded instructions and executing the application logic that is stored on the ASIC. The FPGA acts as a bridge chip between the ASIC and external devices, allowing the ASIC to be swapped for a different ASIC for an updated design or for a different application.

In general, one innovative aspect of the subject matter described in this specification can be embodied in a system including a first integrated circuit chip comprising application logic for one or more executable applications; and a second integrated circuit chip communicatively coupled to the first integrated circuit chip. The second integrated circuit chip includes an instruction decoder configured to decode instructions for executing the one or more executable applications; and a communication interface configured to transmit the decoded instructions to the first integrated circuit chip to execute the one or more executable applications on the first integrated circuit chip.

These and other implementations can each optionally include one or more of the following features. The decoded instructions may be executed in a deterministic manner such that each decoded instruction is executed at a respective predetermined timing. Operations of the first integrated circuit chip and the second integrated circuit chip may be synchronous.

The system may further include a data store configured to store the instructions for executing the one or more executable applications on the first integrated circuit chip, where the instruction decoder may be configured to obtain the instructions from the data store. The data store may be integrated in the second integrated circuit chip. The data store may be separate from the second integrated circuit chip.

The first integrated circuit chip may be an ASIC (Application-Specific Integrated Circuit), and the second integrated circuit chip may be a FPGA (Field-Programmable Gate Array). The system may further include a circuit board including an ASIC socket, where the FPGA is permanently bonded to the circuit board, and where the ASIC is plugged in the ASIC socket. The system may further include multiple sets of SerDes (Serializer/Deserializer), and the ASIC and the FPGA may be communicatively coupled using the multiple sets of SerDes. The system may further include a GPIO (general purpose input/output), where the ASIC and the FPGA may be communicatively coupled using the GPIO to provide an interface for debugging errors in a boot sequence.

The FPGA may include a processor; external I/O interface configured to obtain input data from an external component; and a buffer configured to store a portion of the input data, where the communication interface of the FPGA may be further configured to transmit the input data to the ASIC via the multiple sets of SerDes. The ASIC may further include a memory store configured to store (i) the decoded instructions from the FPGA, and (ii) the input data from the FPGA. The one or more executable applications may include a machine learning model, where the decoded instructions from the FPGA may instruct the ASIC to generate, based on the input data and using the machine learning model, output data indicating a type of objects, among multiple types of candidate objects, that is included in the input data. The ASIC may be configured to transmit the output data to the FPGA via the multiple sets of SerDes. The FPGA may be configured to transmit the output data to the external component via the external I/O interface.

The one or more executable applications may include a second machine learning model, where the FPGA may be configured to determine, based on the output data, that a particular portion of the input data requires additional processing. In response to determining that the particular portion of the input data requires additional processing, the FPGA may transmit decoded instructions to instruct the ASIC to generate, based on the particular portion of the input data and using the second machine learning model, second output data.

The one or more executable applications may include a video decoder, where the input data may include an encoded signal. The decoded instructions from the FPGA may instruct the ASIC to generate, based on the input data and using the video decoder, output data representing a decoded signal, where the ASIC may be configured to transmit the output data to the FPGA via the multiple sets of SerDes.

Another innovative aspect of the subject matter described in this specification can be embodied in a computer-implemented method including obtaining, by a FPGA, instructions for executing one or more executable applications stored in an ASIC; decoding, by the FPGA, the instructions for executing the one or more executable applications; transmitting, from the FPGA and to the ASIC, the decoded instructions and input data for the one or more executable applications; executing, by the ASIC and based on the decoded instructions and the input data, the decoded instructions to execute the one or more executable applications to generate output data; and transmitting, from the ASIC to the FPGA, the output data, where the decoded instructions are executed in a deterministic manner such that each decoded instruction is executed at a respective predetermined timing.

These and other implementations can each optionally include one or more of the following features. The operations of the FPGA and the ASIC may be synchronous. A first portion of the input data may be encrypted by the FPGA using a first key value. The first key value may be updated by the FPGA to generate a second key value. The first portion of the encrypted input data may be decrypted by the ASIC using the first key value without receiving the first key value from the FPGA. The first key value may be updated by the ASIC to generate the second key value. A second portion of the input data may be encrypted by the FPGA using the second key value. The second portion of the encrypted input data may be decrypted by the ASIC using the second key value.

Another innovative aspect of the subject matter described in this specification can be embodied in a method for executing an executable application on an ASIC, the method including receiving, from a FPGA and by an ASIC, data representing (i) decoded instructions, (ii) input data for executing one or more executable applications that are stored in the ASIC, and (iii) memory locations for storing the decoded instructions and the input data; storing, by the ASIC, the decoded instructions and the input data at the memory locations; obtaining, by the ASIC, the decoded instructions and the input data from the memory locations; executing, by the ASIC and based on (i) the decoded instructions, (ii) the input data, and (iii) application logic for the one or more executable applications to generate output data; and transmitting, from the ASIC to the FPGA, the output data.

These and other implementations can each optionally include one or more of the following features. The operations of the FPGA and the ASIC may be synchronous.

The subject matter described in this specification can be implemented in particular embodiments so as to realize one or more of the following advantages. Offloading functionalities from the ASIC to the FPGA reduces potential chip-design errors in the ASIC and may reduce overall cost. The ASIC may be designed to be swappable on the board, and may be customized to handle specific applications or ASIC design improvements over time. Since the FPGA handles communications with external devices, the ASIC may perform computations while the FPGA receives input data, thereby improving overall performance. Executing decoded instructions in a deterministic manner enables an efficient way for executing applications where the latency is not critical for individual operations, or where an application does not use or uses only a few conditional statements. Multiple programs may be barrel-processed by the ASIC. A point-to-point communication between the FPGA and the ASIC with in-order messages allows encryption to be added to the communication protocol, thereby improving security. Different types of FPGA may be selected for different applications. Since the communication between the FPGA and the ASIC is not transparent to the external environment, the bandwidth and/or the balance of communications to the external environment may be modified.

Other implementations of this and other aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

An application-specific integrated circuit (ASIC) is an integrated circuit (IC) that is customized for a particular use. For example, an ASIC may be designed to perform operations of machine learning models, e.g., deep neural networks that recognize objects in images. As another example, an ASIC may be designed for decoding an encoded video stream. In general, integrating different components and complex functions on an ASIC provides potential benefits of reducing transmission latencies among components and reducing manufacturing costs. However, the complexity in ASIC design may lead to errors that cause an increase in development costs and a delay in product shipments. For example, an ASIC for an image-recognition application may be designed to integrate an input/output interface for communicating with a data source, an instruction decoder for decoding a program that runs image-recognition models, a memory that stores the captured image, the image-recognition models, and an operating system, and other components. A design error in any one of these components may render the ASIC inoperable. Moreover, since an ASIC is generally not reprogrammable, an ASIC engineer may need to redesign an ASIC for a similar application having different requirements. In addition, integrating multiple components in an ASIC is generally more beneficial for applications where the latency is critical for individual operations. For applications where the latency is important only for end-to-end computations but not for individual operations within a computation, it may be beneficial to implement some ASIC functionalities on a bridge chip between an external device and the ASIC, such that the overall performance of the computing system may be improved and the overall cost may be reduced.

Figure 1:
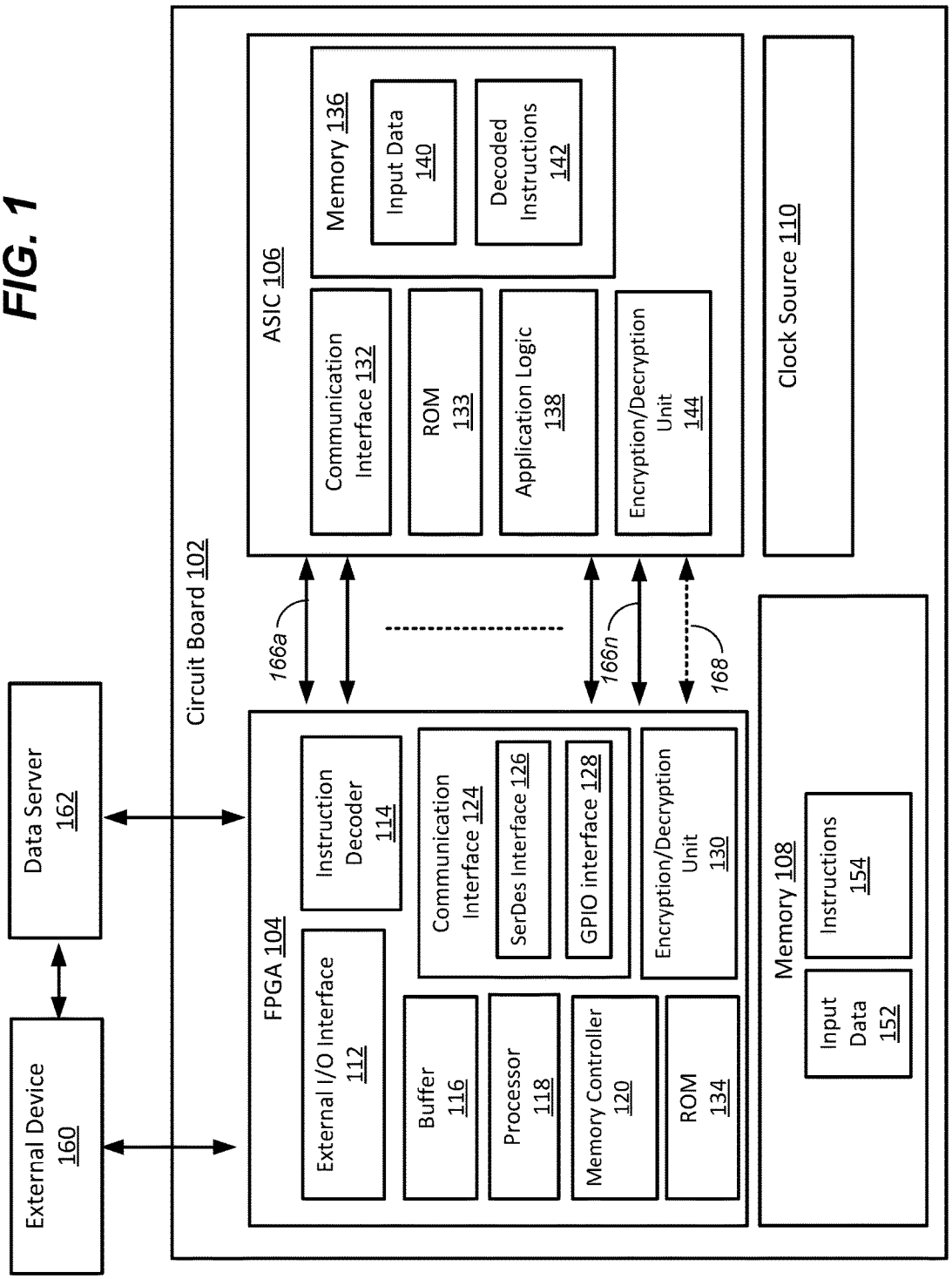
FIG. 1 is a block diagram of an example computing system.

FIG. 1 shows a block diagram of an example computing system 100, where two integrated circuit chips are arranged on a circuit board that is configured to perform computations for a specific application.

The computing system 100 includes a circuit board 102 that includes an FPGA 104, an ASIC 106, a memory 108, and a clock source 110. In general, the FPGA 104 obtains input data from an external device 160 and decodes instructions that are stored in the memory 108. The external device 160 may be a remote data storage, an image-capturing device, a mobile computing device, or any other suitable devices that is external of the circuit board 102. The FPGA 104 transmits the decoded instructions and the input data 152 to the ASIC 106. The ASIC 106 executes the decoded instructions to process the input data 152 using application logic 138, where the application logic 138 is specific to a particular application, such as a particular machine learning model, e.g., an image recognition model, or video decoding or any other suitable applications. Separating the FPGA 104 from the ASIC 106 reduces the functionalities implemented on the ASIC 106, which reduces the ASIC design complexity. The application logic 138 generates output data, and the ASIC 106 transmits the output data to the FPGA 104, where the FPGA 104 may further process the output data and/or transmit additional decoded instructions to the ASIC 106 for further processing. Alternatively or additionally, the FPGA 104 may transmit the output data to a data server 162 and/or the external device 160.

In general, the FPGA 104 is configured to perform functions such as communicating with an external device 160, fetching instructions and data from the memory 108, and decoding the instructions for executing an application on the ASIC 106. In some implementations, the FPGA 104 may be soldered on the circuit board 102. The FPGA 104 may include an external I/O interface 112, an instruction decoder 114, a memory 116, a processor 118, a memory controller 120, a communication interface 124, and an encryption/decryption unit 130.

The external I/O interface 112 is configured to communicate with one or more external devices, including the external device 160 and/or the data server 162. The external I/O interface 112 may be any suitable I/O interface that may be implemented on a FPGA. For example, the external I/O interface 112 may include a PCIe (Peripheral Component Interconnect Express) interface. As another example, the external I/O interface 112 may include an Ethernet interface or another type of data network interface. As another example, the external I/O interface 112 may include an USB interface. In some implementations, the FPGA 104 may be configured to obtain input data from the external device 160 through the external I/O interface 112. For example, the external device 160 may be a cloud-based data store that stores images as input data. As another example, the external device 160 may be a camera installed on a vehicle that captures images from surroundings. As another example, the external device 160 may be a mobile phone that captures images.

The instruction decoder 114 is configured to decode instructions to generate decoded instructions that may be executed on the ASIC. The instruction decoder 114 may be any instruction decoder that may be implemented on a FPGA. In some implementations, the instructions may be stored in a memory 108. The memory controller 120 may retrieve instructions 154 from the memory 108, and the instruction decoder 114 may decode the retrieved instructions 154. As an example, the instructions 154 may be a script or a program written in a format that may be decoded by the instruction decoder 114. In some implementations, the instructions 154 may conform to an application program interface (API). For example, the instructions 154 may conform to an API developed for machine learning. The output of the instruction decoder 114 are decoded instructions that may be executed on the ASIC. For example, the decoded instructions may be micro-codes or other suitable hardware codes that may be executed on the ASIC without decoding.

The buffer 116 is configured to temporarily store data such as the input data obtained from the external device 160 or input data 152 retrieved from the memory 108. The buffer 116 may be any suitable memory elements that may be implemented on a FPGA. For example, buffer 116 may be implemented using a static random access memory (SRAM). In some implementations, a data transmission rate from the external device 160 to the FPGA 104 may be greater than a data transmission rate from the FPGA 104 to the memory 108, and the buffer 116 may be used to temporarily store the input data.

The processor 118 is configured to control components of the FPGA 104. The processor 118 may be any suitable processor that may be implemented on a FPGA. For example, the processor 118 may be implemented using an ARM processor. The memory controller 120 is configured to control the memory 108. The memory 108 stores data including the input data 152 and instructions 154. The memory 108 may be any suitable memory devices that may be implemented on the circuit board 102. For example, the memory 108 may be implemented using a double data rate synchronous dynamic random-access memory (DDR SDRAM). In some implementations, the data stored in the memory 108 may be preloaded. In some other implementations, the data stored in the memory 108 may be received from the FPGA 104.

The communication interface 124 is configured to communicate with the communication interface 132 of the ASIC 106 to provide a communication channel between the FPGA 104 and the ASIC 106. In general, the connection between the FPGA 104 and the ASIC 106 is a point-to-point connection. In some implementations, the communications between the FPGA 104 and the ASIC 106 are not transparent to external devices, and a proprietary communications protocol may be used. In some implementations, the communications interface 124 includes multiple sets of serializer/deserializer (SerDes) interfaces 126 and a general purpose input/output (GPIO) interface 128.

The SerDes interface 126 is configured to provide the decoded instructions and/or the input data to the ASIC 106 and to receive output data from the ASIC 106. For example, the SerDes interface 126 may be configured to transmit the decoded instructions and/or the input data at a rate of 32 Gbps, 64 Gbps, or any suitable data rate over the n sets of SerDes connections $166a$-$166n$. In some implementations, a subset of SerDes 126 may be used to transmit the decoded instructions and/or the input data depending on the application requirements. In some implementations, the data transmission protocol used by the SerDes interface 126 may be standardized, such that the FPGA 104 and/or the ASIC 106 may be swapped, and the remaining component may continue communicating with the swapped component.

The GPIO interface 128 is configured to provide an interface for debugging. For example, when the computing system 100 is powered on, the FPGA 104 and the ASIC 106 may each run a boot program. If there is a failure, an administrator of the computing system 100 may use the GPIO interface 128 to tap the GPIO connection 168 to debug the source of the failure.

Figure 3:
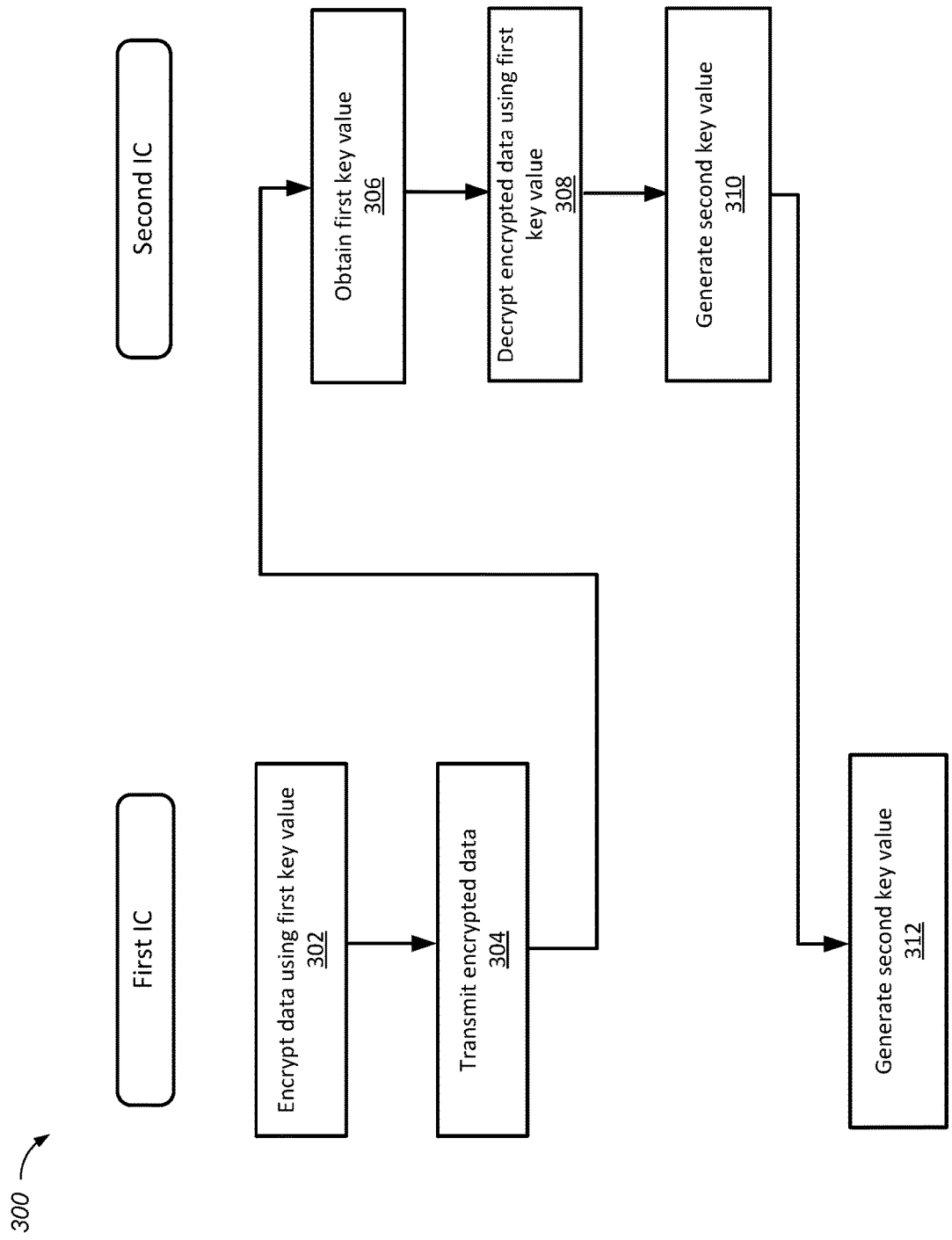
FIG. 3 is a flow diagram that illustrates an example of a process for encrypting and decrypting data.

The encryption/decryption unit 130 is configured to encrypt the data to be transmitted to the ASIC 106 via the communication interface 124. Since the connection between the FPGA 104 and the ASIC 106 is a point-to-point connection, any suitable cryptographic protocol may be used for the connection. One advantage of using a cryptographic protocol is transmission security. Another advantage of using a cryptographic protocol is that since the sequence generated by the cryptographic protocol is likely to be random, there is no need for performing additional data scrambling on the SerDes to achieve a DC balance. For example, if the content of the data includes a string of zeros, appending the random sequence of the string of zeros would improve the DC balance (i.e., the number of zeros compared with the number of ones) of the data. Another advantage of using a cryptographic protocol, as described in more detail below with reference to FIG. 3, is that if operations of the FPGA 104 and the ASIC 106 are deterministic, both the FPGA 104 and the ASIC 106 may track generated key codes based on the respective clock cycles. This would eliminate the need to exchange key codes via the SerDes, which would improve bandwidth performance.

The read-only memory (ROM) 134 is configured to store a boot program for the FPGA 104. The ROM 134 may be any suitable ROM elements that may be implemented on a FPGA. For example, the ROM 134 may be implemented using a flash memory. When the computing system 100 is powered on, the FPGA 104 may retrieve the boot program from the ROM 134 and run the boot program to initialize the components on the FPGA 104. In some implementations, as described in more detail below with reference to FIG. 2, the FPGA 104 may initialize a communication connection with the ASIC 106.

In general, the ASIC 106 is configured to execute the decoded instructions transmitted from the FPGA 104, and based on the executed instructions, the ASIC 106 is configured to process the input data using application logic 138. In some implementations, the ASIC 106 may be coupled to the circuit board 102 via a socket on the circuit board 102, which enables the ASIC 106 to be swapped for an updated design or for an ASIC for a different application. The ASIC 106 includes a communication interface 132, a ROM 133, application logic 138, an encryption/decryption unit 144, and a memory 136. The communication interface 132 is similar to the communication interface 124. The encryption/decryption unit 144 is similar to the encryption/decryption unit 130. The memory 136 is configured to store the decoded instructions 142 and/or the input data 140 received from the FPGA 104.

The application logic 138 includes one or more executable applications that may be executed by the decoded instructions. The application logic 138 may include hardware codes (e.g., micro-codes) and/or circuitry that are implemented on the ASIC 106, where the application logic 138 may receive input data and generate output data based on the input data. For example, the application logic 138 may include circuitry configured to implement a neural network model trained to perform image recognition tasks, where the input data may be a captured image, and where the output data may be a probability that the captured image includes a type of candidate objects. As another example, the application logic 138 may include a video decoder configured to decode an encoded video, where the input data may be an encoded video stream, and where the output data may be a decoded video stream. As another example, the application logic 138 may include a matrix multiplier configured to perform linear algebra operations, where the input data may be a matrix, and where the output data may be a processed matrix. As another example, the application logic 138 may include a loop sequencer configured to parse through a for-loop, where the input data may be processed by the for-loop and the output data may be the output of the for-loop.

The ROM 133 is configured to store a boot program for the ASIC 106. The ROM 133 may be any suitable ROM elements that may be implemented on an ASIC. When the computing system 100 is powered on, the ASIC 106 may retrieve the boot program from the ROM 133 and run the boot program to initialize the components on the ASIC 106. In some implementations, as described in more detail below with reference to FIG. 2, the ASIC 106 may initialize a communication connection with the FPGA 104.

The clock source 110 is configured to provide a clock signal to the FPGA 104 and the ASIC 106. In some implementations, the FPGA 104 and the ASIC 106 operate synchronously at the same clock frequency. In some other implementations, the FPGA 104 and the ASIC 106 operate synchronously, where one is operated at a divided clock frequency. For example, the FPGA 104 may be operated at 2 GHz while the ASIC 106 may be operated synchronously at 1 GHz. In some implementations, the FPGA 104 and the ASIC 106 operate synchronously at a predetermined clock offset. For example, the FPGA 104 may operate one clock cycle ahead of the ASIC 106.

In some implementations, the ASIC 106 may execute the decoded instructions in a deterministic manner, such that each decoded instruction is executed at a respective predetermined timing that is common to both the FPGA 104 and the ASIC 106. Deterministic computations work well for programs where the program flow does not vary frequently. As an example, at clock cycle $k_1$, the ASIC 106 may receive a first decoded instruction that instructs the ASIC 106 to store (i) a second decoded instruction received at clock cycle $k_2$ to a memory location $m_0$ in the memory 136 and (ii) input data received at clock cycle $k_3$ to a memory location $m_1$ in the memory 136. Each of the clock cycles $k_2, k_3, \ldots,$ and $k_n$ refers to a clock cycle that occurs later than the respective previous clock cycle. For example, the clock cycle $k_2$ may be 1 clock cycle, 10 clock cycles, 20 clock cycles, or any number of clock cycles later than the previous clock cycle $k_1$, as specified by the first decoded instruction.

At clock cycle $k_2$, the ASIC 106 receives the second decoded instruction from the FPGA 104, and the ASIC 106 stores the second decoded instruction to memory location $m_0$ in the memory 136.

At clock cycle $k_3$, the ASIC 106 receives the input data from the FPGA 104, and the ASIC 106 stores the second decoded instruction to memory location $m_0$ in the memory 136.

At clock cycle $k_4$, the ASIC 106 receives a third decoded instruction from the FPGA 104 that instructs the ASIC 106 (i) to retrieve, at clock cycle $k_5$, the stored second decoded instruction from the memory location $m_0$ in the memory 136 and (ii) to execute, at clock cycle $k_6$, the second decoded instruction.

At clock cycle $k_5$, the ASIC 106 retrieves the stored second decoded instruction from the memory location $m_0$ in the memory 136.

At clock cycle $k_6$, the ASIC 106 executes the second decoded instruction, which instructs the ASIC 106 (i) to retrieve, at clock cycle $k_7$, the input data from the memory location $m_1$ in the memory 136, (ii) to execute, at clock cycle $k_8$, a machine-learning model in the application logic 138 using the retrieved input data as input, and (iii) to transmit, at clock cycle $k_9$, output data generated by the application logic 138 to the FPGA 104.

At clock cycle $k_7$, the ASIC 106 retrieves the stored input data from the memory location $m_1$ in the memory 136.

At clock cycle $k_8$, the ASIC 106 executes the machine-learning model using the retrieved input data as input to generate output data.

At clock cycle $k_9$, the ASIC 106 transmits the output data to the FPGA 104 via the SerDes. Since the decoded instructions have been executed in a deterministic manner, the FPGA 104 expects to receive the output data from the ASIC 106 at clock cycle $k_9$. In some implementations, if the FPGA 104 does not receive the output data from the ASIC 106 at clock cycle $k_9$ (e.g., receive data has a NULL value), or if the output data is garbage data (e.g., the computation by the machine-learning model has not completed by clock cycle $k_9$), the FPGA 104 may issue an error message to the data server 162 or the external device 160.

Since the computations are deterministic, after the FPGA 104 sends a decoded instruction to the ASIC 106 to execute an application implemented using the application logic 138, the FPGA 104 may determine a computation time required by the application logic 138 to execute the application. In some implementations, the FPGA 104 may send a first decoded instruction to instruct the ASIC 106 to execute an application and to store the output data to a specific memory location on the ASIC 106. After the determined amount of time that corresponds to the computation time required by the application logic 138 to execute the application, the FPGA 104 may send a second decoded instruction to instruct the ASIC 106 to retrieve the output data from the specific memory location and transmits the retrieved output data to the FPGA 104.

In some implementations, after the FPGA 104 receives the output data from the ASIC 106, the FPGA 104 may transmit the output data to the data server 162 for further processing. For example, if the machine-learning model is for an image-recognition application, the output data may include a matrix indicating possibilities of candidate objects that may be included in the input data (e.g., a source image). The data server 162 may process the matrix and generate a user interface that can be displayed on the external device 160 to inform a user of the external device 160 the candidate objects that are included in the source image.

Notably, deterministic computations work efficiently even if there is data-based branching in the overall program. In some implementations, after the FPGA 104 receives the output data from the ASIC 106, the FPGA 104 may process the output data to determine whether to send additional decoded instructions to the ASIC for additional processing of the input data using the application logic 138. For example, if the FPGA 104 determines that the output data from the machine-learning model indicates that a portion of the input data (e.g., a region of a source image) includes an animal, the FPGA 104 may send decoded instructions to the ASIC 106 to execute a different machine-learning model using the portion of the input data to determine the type of animal that is included in the source image. As another example, if the FPGA 104 determines that the output data from the machine-learning model indicates that a portion of the input data (e.g., a region of a source image) includes a traffic light, the FPGA 104 may send decoded instructions to the ASIC 106 to execute a different machine-learning model using the portion of the input data to determine whether the traffic light is green, yellow, or red. In some other implementations, after the FPGA 104 receives the output data from the ASIC 106, the FPGA 104 may transmit the output data to another system component without processing the output data.

In some implementations, the ASIC 106 may perform one or more power operations under deterministic computations. For example, if a decoded instruction specifies that a particular memory location is to be accessed x clock cycles later, the ASIC 106 may issue a power-down instruction to the particular memory location between the time that the decoded instruction was received until x clock cycles later.

Since the timings for storing, retrieving, processing, and outputting data are known by the FPGA 104 and the ASIC 106 in deterministic computing, in some implementations, the FPGA 104 may interleave decoded instructions for two or more program flows to be transmitted to the ASIC 106, such that the computing system 100 may process multiple programs in a parallel manner.

Figure 2:
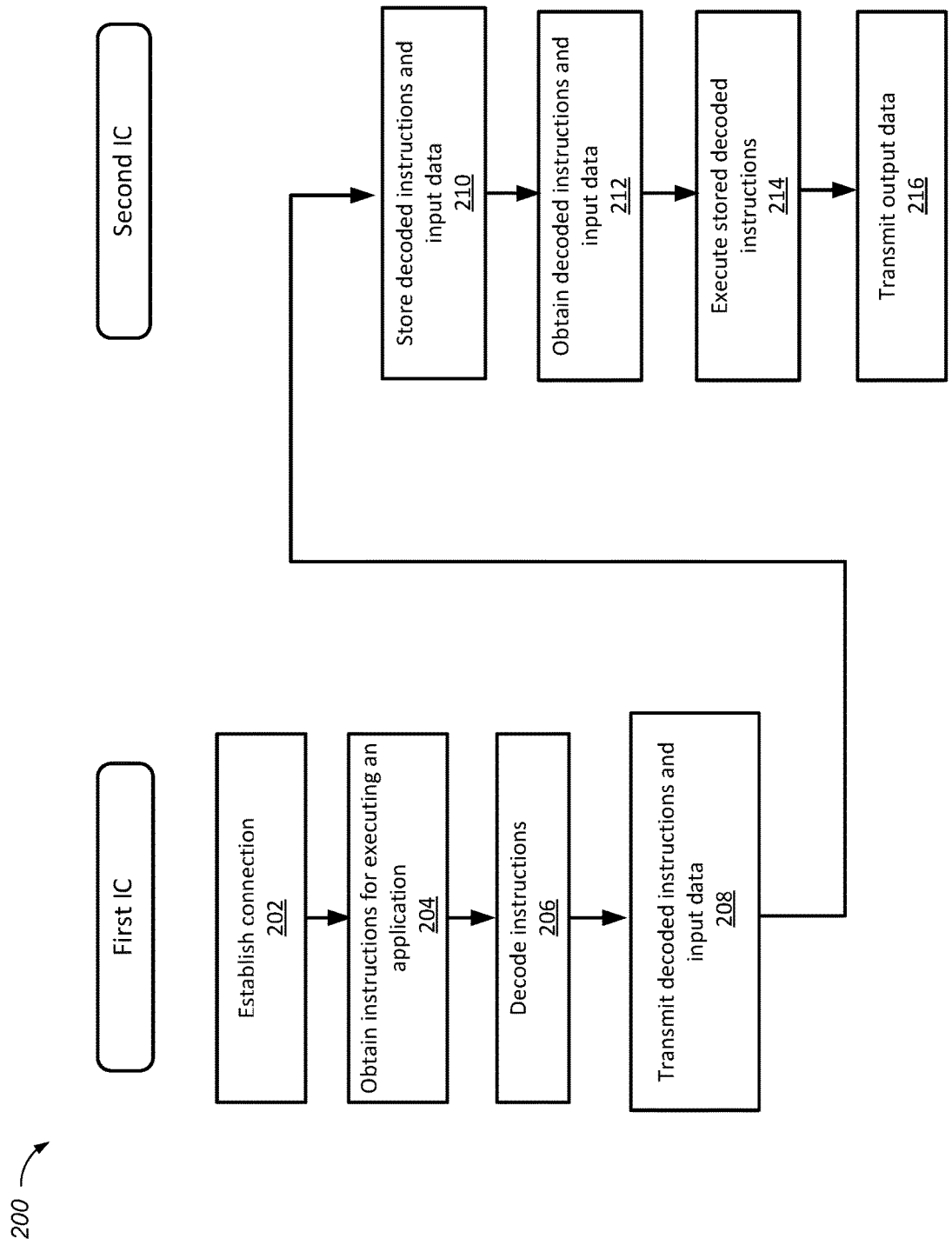
FIG. 2 is a flow diagram that illustrates an example of a process for decoding instructions on a first IC and executing an application on a second IC.

FIG. 2 is a flow diagram that illustrates an example of a process 200 for decoding instructions on a first IC and executing an application on a second IC. The process 200 may be performed by a system, such as the circuit board 102 as described in reference to FIG. 1.

The first IC establishes a connection with the second IC (202). For example, when the circuit board 102 is powered up, the FPGA 104 and the ASIC 106 may each run a boot program that initialize the components of the FPGA 104 and the ASIC 106, respectively. In some implementations, the FPGA 104 and the ASIC 106 may establish a connection using a handshake scheme. The handshake scheme may not be deterministic. For example, the FPGA 104 may transmit a request via the SerDes interface 124 to the SerDes interface 132 of the ASIC 106 to request a connection with the ASIC 106. The ASIC 106 may transmit an acknowledge response via the SerDes interface 132 to the SerDes interface 124 to establish the connection, where the clock cycle for transmitting the acknowledge response is not deterministic (i.e., the clock cycle for receiving the acknowledge response is uncertain). In some implementations, the FPGA 104 and the ASIC 106 may each run a clock signal synchronization program to determine whether there is any delay between the clock signal received by the FPGA 104 and the clock signal received by the ASIC 106.

The first IC obtains instructions for executing an application (204). For example, the FPGA 104 may retrieve instructions 154 from the memory 108 for executing application logic 138 on the ASIC 106. The first IC decodes the instructions (206). For example, the instruction decoder 114 may decode the retrieved instructions 154 to generate decoded instructions.

The first IC transmits the decoded instructions and input data to the second IC (208). For example, the FPGA 104 may transmit the decoded instructions and the input data 152 to the ASIC 106 via SerDes 166a-166n.

The second IC stores the decoded instructions and the input data (210). For example, the ASIC 106 may execute a first instruction that specifies (i) memory locations for storing the other decoded instructions and the input data, and (ii) timings for retrieving and executing the other decoded instructions and the input data.

The second IC obtains the decoded instructions and the input data based on the data for deterministic computations (212). For example, based on the specified timing, the ASIC 106 may retrieve a second instruction and a portion of the input data from the memory 136.

The second IC executes stored decoded instructions based on the data for deterministic computations (214). For example, based on the specified timing, the ASIC 106 may execute the second instruction, which may specify the ASIC 106 to execute the application logic 138 using the portion of the retrieved input data as input.

The second IC transmits the output data to the first IC (216). For example, the application logic 138 may generate output data, and the ASIC 106 may transmit the output data to the FPGA 104 for further processing.

FIG. 3 is a flow diagram that illustrates an example of a process for encrypting and decrypting data between two integrated circuit chips. The process 300 may be performed by a system, such as the circuit board 102 as described in reference to FIG. 1.

The first IC encrypts data using a first key value (302). For example, the FPGA 104 and the ASIC 106 share a common clock source 110. The FPGA 104 and the ASIC 106 may operate synchronously either under the same timing or under a known timing offset. Under the same timing scheme, the FPGA 104 and the ASIC 106 may generate the same random number. The FPGA 104 and the ASIC 106 may use the random number as a first key without communicating the random number to each other. The encryption/decryption unit 130 of the FPGA 104 may encrypt a decoded instruction and/or the input data using the first key. For example, the FPGA 104 may append the first key to the end of the decoded instruction and/or the input data. The encryption process serves the purposes of (i) added security to the data and (ii) DC balance the load of the data (i.e., avoiding a long sequence of zeros or ones in a transmitted data stream).

The first IC transmits the encrypted data to the second IC (304). For example, the FPGA 104 may transmit the encrypted decoded instructions and the input data to the ASIC 106 via SerDes 166a-166n.

The second IC obtains the first key value (306). For example, under the same clock cycle, the ASIC 106 may generate the same random number, and use the random number as the first key.

The second IC decrypts the encrypted data using the first key value (308). For example, the encryption/decryption unit 144 of the ASIC 106 may decrypt the encrypted data received from the FPGA 104 by performing an XOR operation using the first key value as a mask to remove the random number that was appended to the end of the decoded instruction and/or the input data.

The first IC and the second IC generate a second key value (310 and 312). For example, in the next clock cycle, the FPGA 104 and the ASIC 106 may generate another random number, and use the new random number as the second key value for encrypting and decrypting the transmitted data, i.e., repeating steps 302-312 with the second key value.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array), an ASIC (application specific integrated circuit), or a GPGPU (General purpose graphics processing unit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:
1. A system comprising:
a first integrated circuit chip comprising application logic for one or more executable applications; and
a second integrated circuit chip communicatively coupled to the first integrated circuit chip, the second integrated circuit chip comprising:
an instruction decoder configured to decode instructions for executing the one or more executable applications; and
a communication interface configured to transmit the decoded instructions to the first integrated circuit chip to execute the one or more executable applications on the first integrated circuit chip, wherein the first integrated circuit chip is an ASIC (Application-Specific

Integrated Circuit), and wherein the second integrated circuit chip is a FPGA (Field-Programmable Gate Array).

2. The system of claim 1, wherein operations of the ASIC and the FPGA are synchronous.

3. The system of claim 1, further comprising a data store configured to store the instructions for executing the one or more executable applications on the ASIC, and
wherein the instruction decoder is configured to obtain the instructions from the data store.

4. The system of claim 3, wherein the data store is integrated in the FPGA.

5. The system of claim 3, wherein the data store is separate from the FPGA.

6. The system of claim 1, further comprising:
a circuit board comprising an ASIC socket,
wherein the FPGA is permanently bonded to the circuit board, and
wherein the ASIC is plugged in the ASIC socket.

7. The system of claim 1,
wherein the system further comprises multiple sets of SerDes (Serializer/Deserializer), and
wherein the ASIC and the FPGA are communicatively coupled using the multiple sets of SerDes.

8. The system of claim 7,
wherein the system further comprises a GPIO (general purpose input/output), and
wherein the ASIC and the FPGA are communicatively coupled using the GPIO to provide an interface for debugging errors in a boot sequence.

9. The system of claim 7,
wherein the FPGA further comprises:
a processor;
external I/O interface configured to obtain input data from an external component; and
a buffer configured to store a portion of the input data,
wherein the communication interface of the FPGA is further configured to transmit the input data to the ASIC via the multiple sets of SerDes, and
wherein the ASIC further comprises:
a memory store configured to store (i) the decoded instructions from the FPGA, and (ii) the input data from the FPGA.

10. The system of claim 9,
wherein the one or more executable applications include a machine learning model,
wherein the decoded instructions from the FPGA instructs the ASIC to generate, based on the input data and using the machine learning model, output data indicating a type of objects, among multiple types of candidate objects, that is included in the input data, and
wherein the ASIC is configured to transmit the output data to the FPGA via the multiple sets of SerDes.

11. The system of claim 10, wherein the FPGA is configured to transmit the output data to the external component via the external I/O interface.

12. The system of claim 10,
wherein the one or more executable applications include a second machine learning model,
wherein the FPGA is configured to:
determine, based on the output data, that a particular portion of the input data requires additional processing; and
in response to determining that the particular portion of the input data requires additional processing, transmit decoded instructions to instruct the ASIC to generate, based on the particular portion of the input data and using the second machine learning model, second output data.

13. The system of claim 9,
wherein the one or more executable applications include a video decoder,
wherein the input data includes an encoded signal, and
wherein the decoded instructions from the FPGA instructs the ASIC to generate, based on the input data and using the video decoder, output data representing a decoded signal, and
wherein the ASIC is configured to transmit the output data to the FPGA via the multiple sets of SerDes.

14. A computer-implemented method, comprising:
obtaining, by a first integrated circuit chip, instructions for executing one or more executable applications stored in a second integrated circuit chip;
decoding, by the first integrated circuit chip, the instructions for executing the one or more executable applications;
transmitting, from the first integrated circuit chip and to the second integrated circuit chip, the decoded instructions and input data for the one or more executable applications;
executing, by the second integrated circuit chip and based on the decoded instructions and the input data, the decoded instructions to execute the one or more executable applications to generate output data; and
transmitting, from the second integrated circuit chip to the first integrated circuit chip, the output data,
wherein the decoded instructions are executed in a deterministic manner such that each decoded instruction is executed at a respective predetermined timing.

15. The method of claim 14, wherein operations of the first integrated circuit chip and the second integrated circuit chip are synchronous.

16. The method of claim 14, wherein transmitting, from the first integrated circuit chip and to the second integrated circuit chip, the input data further comprises:
encrypting, by the first integrated circuit chip, a first portion of the input data using a first key value;
updating, by the first integrated circuit chip, the first key value to generate a second key value;
decrypting, by the second integrated circuit chip the first portion of the encrypted input data using the first key value without receiving the first key value from the first integrated circuit chip;
updating, by the second integrated circuit chip, the first key value to generate the second key value;
encrypting, by the first integrated circuit chip, a second portion of the input data using the second key value; and
decrypting, by the second integrated circuit chip, the second portion of the encrypted input data using the second key value.

17. A method for executing an executable application, the method comprising:
receiving, from a first integrated circuit chip and by a second integrated circuit chip, data representing (i) decoded instructions, (ii) input data for executing one or more executable applications that are stored in the second integrated circuit chip, and (iii) memory locations for storing the decoded instructions and the input data;
storing, by the second integrated circuit chip, the decoded instructions and the input data at the memory locations;

obtaining, by the second integrated circuit chip, the decoded instructions and the input data from the memory locations;

executing, by the second integrated circuit chip and based on (i) the decoded instructions, (ii) the input data, and (iii) application logic for the one or more executable applications to generate output data; and transmitting, from the second integrated circuit chip to the first integrated circuit chip, the output data.

18. The method of claim 17, wherein operations of the first integrated circuit chip and the second integrated circuit chip are synchronous.

* * * * *